(12) United States Patent
Popek

(10) Patent No.: US 12,273,022 B2
(45) Date of Patent: Apr. 8, 2025

(54) ACTIVE RECTIFIER HARMONICS COMPENSATOR

(71) Applicant: Hamilton Sundstrand Corporation, Charlotte, NC (US)

(72) Inventor: Grzegorz Popek, Birmingham (GB)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 249 days.

(21) Appl. No.: 17/957,112

(22) Filed: Sep. 30, 2022

(65) Prior Publication Data

US 2023/0107678 A1  Apr. 6, 2023

(30) Foreign Application Priority Data

Oct. 4, 2021 (EP) .................................. 21275141

(51) Int. Cl.
| | |
|---|---|
| *H02M 1/12* | (2006.01) |
| *G01R 23/02* | (2006.01) |
| *G01R 25/00* | (2006.01) |
| *H02M 1/00* | (2007.01) |
| *H02M 1/08* | (2006.01) |
| *H02M 7/219* | (2006.01) |

(52) U.S. Cl.
CPC .............. *H02M 1/12* (2013.01); *G01R 23/02* (2013.01); *G01R 25/00* (2013.01); *H02M 1/0009* (2021.05); *H02M 1/08* (2013.01); *H02M 7/219* (2013.01)

(58) Field of Classification Search
CPC ........ H02M 1/12; H02M 1/0009; H02M 1/08; H02M 7/219; H02M 7/487; G01R 23/02; G01R 25/00; Y02F 40/40
See application file for complete search history.

(56) References Cited

U.S. PATENT DOCUMENTS

| | | | |
|---|---|---|---|
| 7,746,024 B2 | 6/2010 | Rozman et al. | |
| 7,821,145 B2 | 10/2010 | Huang et al. | |
| 9,054,586 B2 | 6/2015 | Wei et al. | |
| 10,050,549 B2 * | 8/2018 | Gonzalez-Espin | ..... H02M 1/15 |
| 10,141,875 B2 | 11/2018 | Huang et al. | |
| 10,312,849 B2 | 6/2019 | Huang | |
| 10,541,598 B1 | 1/2020 | Rozman et al. | |

(Continued)

OTHER PUBLICATIONS

European Search Report for Application No. 21275141.6, mailed Mar. 10, 2022, 10 pages.

(Continued)

*Primary Examiner* — Sisay G Tiku
*Assistant Examiner* — Yahveh Comas Torres
(74) *Attorney, Agent, or Firm* — CANTOR COLBURN LLP

(57) ABSTRACT

A compensator circuit for a PWM active rectifier includes a look up table containing compensating voltage values for given values of input phase current and input voltage frequency, and a low pass filter arranged to filter the input phase current to the rectifier based on a filter bandwidth determined according to the input voltage frequency. The compensator circuit arranged to receive measured input current and voltage frequency values and to output corresponding compensation voltage values from the look up table, the compensation voltages to be provided, in use, to the rectifier to adjust the switching pattern of the rectifier.

6 Claims, 1 Drawing Sheet

(56) References Cited

U.S. PATENT DOCUMENTS

Figure 1:
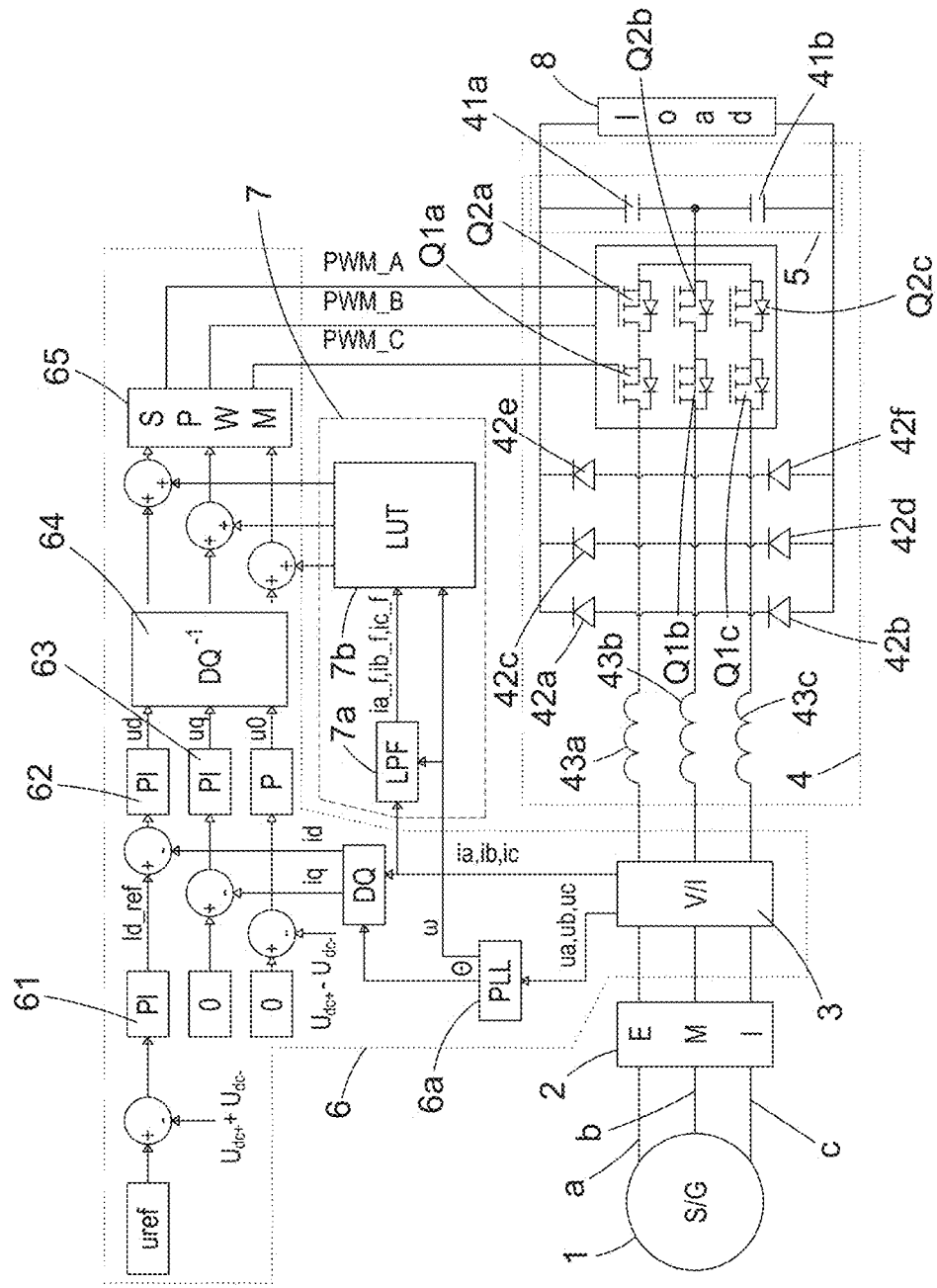

| 10,601,343 | B1* | 3/2020 | Lamb | H02M 1/088 |
| 2004/0047166 | A1* | 3/2004 | Lopez-Santillana | H02M 7/53873 363/89 |
| 2005/0035815 | A1* | 2/2005 | Cheng | H02J 3/01 327/552 |
| 2005/0068001 | A1* | 3/2005 | Skaug | H02M 1/10 318/807 |
| 2013/0033907 | A1* | 2/2013 | Zhou | H02J 3/01 363/37 |

OTHER PUBLICATIONS

Mobarrez Maziar, et al. "A Control Method for THD Minimization in High Power Density Vienna-type Rectifier", 2021 EEE Applied Power Electronics Conference and Exposition (APEC), IEEE, Jun. 14, 2021, pp. 921-926.

Ni Ruoshui, et al. "Virtual Impedance-Based Selective Harmonic Compensation (VI-SHC) PWM for Current Source Rectifiers", IEEE Transactions on Power Electronics, Institute of Electrical and Electronics Engineers, USA, Vo. 29, No. 7, Jul. 1, 2014, pp. 3346-3356.

Song Wei_Zhang, et al: "A Hybrid Control Method to Suppress the Three-Time Fundamental Frequency Neutral-Point Voltage Fluctuation in a Vienna Rectifier", IEEE Journal of Emerging and Selected Topics in Power Electronics, IEEE, vol. 4, No. 2, Jun. 1, 2016, pp. 468-480.

Song Wei-Zhang, et al. "Two-Methods for Controlling Three-time Fundamental Frequency Neutral-Point Voltage Oscillation in a Hybrid Vienna Rectifier", IET Power Electronics, IET, UK, vol. 12, No. 4, Apr. 10, 2019, pp. 932-943.

Xu Bo, et al. "Computationally Efficient Optimal Switching Sequence Model Predictive Control for Three-Phase Vienna Rectifier Under Balanced and Unbalanced DC Links", IEEE Transactions on Power Electronics, Institute of Electrical and Electronics Engineers, vol. 36, No. 11, May 21, 2021, pp. 12268-12280.

Yue Shixin et al. "Neutral-Point Oscillation Suppression for Vienna Rectifier Based on Small DC-Link Capcitor", 2019 22nd International Conference on Electrical Machines and Systems (ICEMS), IEEE, Aug. 11, 2019, pp. 1-6.

Zhang Binfeng et al., "Control Scheme Design for Isolated Swiss-Rectifier Based on Phase-Shifted Full-Bridge Topology", 2019 IEEE Applied Power Electronics Conference and Exposition (APEC), IEEE, Mar. 17, 2019, pp. 2092-2096.

\* cited by examiner

ACTIVE RECTIFIER HARMONICS COMPENSATOR

CROSS-REFERENCE TO RELATED APPLICATIONS

This application claims priority to European Patent Application No. 21275141.6 filed Oct. 4, 2021, the entire contents of which is incorporated herein by reference.

TECHNICAL FIELD

The present disclosure relates to a power converter active rectifier control to provide harmonics compensation to satisfy power quality requirements.

BACKGROUND

Conversion of AC power to DC power using a power convertor is used in many applications where one or more DC loads is to be driven from an AC power source. Conventional diode bridge rectifiers are used to provide the desired power conversion. Various types of rectifiers are known, many of which now use semiconductor switching technology. A problem with providing power to DC loads is that devices with non-linear characteristics, e.g. where the current of the load is not proportional to the applied voltage, can cause undesired reactive power flow and generation of harmonics. The harmonics can propagate through the system and cause harmonic distortions in the system. This results in power quality (PQ) problems. Various industry standards have been set to ensure compliance with minimum power quality criteria. Some of these standards define limits for harmonics injected into the system. Particularly in safety critical applications such as in aircraft, there are very strict constraints on the components and circuitry that can be used in power converters to ensure that all PQ constraints are met.

Traditionally, passive rectifiers such as diode or 12-pulse, 18-pulse rectifiers have been used with passive LC or high pass filters at the AC side to suppress harmonics, and with large power capacitors at the DC side to improve the power factor and improve the power quality of the system.

With increasing use of non-linear switching devices, more power converters are being designed with active filter circuitry for harmonic compensation. Active rectifiers generally combine a diode bridge with switches. The switching of the switches is controlled by means of a pulse width modulator that outputs switching control signals based on the DC voltage and a reference voltage to provide harmonics compensation.

More recently, power factor correction converters (PFCs) or improved power quality converters (IPQCs) have been developed to incorporate circuitry for improving power quality into the power converter. Here the PWM switching pattern controls the switching pattern and duty cycle of the rectifier switches to compensate for harmonic distortion. Such PWM converters result in low line side current distortions and constant DC link voltage requiring only a small output filter capacitor. An example of an active controlled power converter is a Vienna rectifier. Semiconductor switches are provided to control the diode voltage. The switching of the switches is dependent on a control signal applied to gate driver circuitry. The control signal is provided via a PWM modulator.

The PWM rectifier can be controlled to compensate for distortions using vector control or direct power control techniques to provide inputs to the PWM modulator based on a voltage error in the system. Such controls use an outer voltage control loop and an inner current control loop as will be described further below and as is known in the art. The inner current controller controls the input line currents to track a reference current. The voltage control loop regulates the output voltage of the rectifier. The current controller outputs a reference voltage which is provided to the PWM modulator to generate PWM pulses for the rectifier switches. In brief, the output of the voltage control loop is multiplied by the power supply input voltage, provided via a phase-locked loop to form three line-current commands for the three phases of the rectifier. To compensate for imbalances in the output DC voltage, a voltage compensator acts on the line-current commands. An error between the current commands and the actual measured line current of each phase is provided to the current control loop and the reference current is used to control the PWM modulator to provide an appropriate duty cycle for the rectifier switches.

Whilst active rectifiers are advantageous over passive rectifiers in that they result in lower losses and are smaller and lighter, to effectively reduce harmonic distortions additional complex controls are required which add to the cost and weight of the rectifier. Even though many rectifiers, e.g. Vienna rectifiers, have good PQ, the sinusoidal signals in the system are still not truly sinusoidal. Distortions are still found to occur, particularly at the zero current crossing areas and because of e.g. time delays in switching at low currents. The known converters are, through their control circuitry, demanding a given duty cycle for switching the switches, but, particularly at low currents, the switches are switching too slowly and are not meeting the demanded duty cycle.

There is a need for an active rectifier with effective harmonics compensation to improve power quality without increasing the weight or losses of the system.

SUMMARY

According to the disclosure, there is provided compensator circuit for a PWM active rectifier, the compensator circuit comprising a look up table containing compensating voltage values for given values of input phase current and input voltage frequency, and a low pass filter arranged to filter the input phase current to the rectifier based on a filter bandwidth determined according to the input voltage frequency, the compensator circuit arranged to receive measured input current and voltage frequency values and to output corresponding compensation voltage values from the look up table, the compensation voltages to be provided, in use, to the rectifier to adjust the switching pattern of the rectifier.

There is also a method of controlling the switching of switches of an active rectifier, comprising providing a duty cycle control signal to the switches based on an error between a commanded voltage and a measured output voltage and a compensation voltage derived from a look up table based on input phase current and input voltage frequency values.

A controller and a power converter are also provided.

BRIEF DESCRIPTION

Examples of the method and system of this disclosure will be described in detail with reference to the drawing. It should be noted that these are examples only and variations are possible within the scope of the claims.

FIG. 1 shows an example of an active rectifier with a compensator according to the disclosure.

DETAILED DESCRIPTION

FIG. 1 is a schematic diagram of an active rectifier incorporating harmonics compensation according to this disclosure.

As is well known, a power converter provides DC power to one or more DC loads 8 from an AC power source 1 e.g. a power grid or network or, for aircraft, an on-board power supply. Briefly, the input power is filtered by an input EMI filter 2 and provided to a rectifier bridge 4 which converts the input power to DC power output, across one or more (here two) DC-side capacitors 41a, 41b to power the load 8. In the example shown, the power is three-phase input power provided on phase lines a, b, c and the rectifier comprises six diodes 42a, 42b, 42c, 42d, 42e, 42f (two per phase). Each line has an inductance 43a, 43b, 43c. Whilst various rectifier topologies can be used with the compensation technique of this disclosure, the rectifier 4 in this example is in the form of a Vienna rectifier including a pair of switches Q1a, Q2a: Q1b, Q2b: Q1c, Q2c for each input phase line. The switches Q are switched on and off according to a control signal to control the operation of the rectifier and the output voltage. The operation of a rectifier, including the operation of a Vienna rectifier, is known and will not be described in further detail.

Control architecture 6 is provided to provide the control signal for switching the rectifier switches Q based on the voltage error of the system. The control architecture uses the DQ (synchronous) reference frame as is known to simplify control because the input signals to the control are then all DC—i.e. time independent. The general control architecture is known and will, again, only be described briefly. The control circuitry is set to control current for unity power factor operation—i.e. the ideal situation where the voltage and current are in phase. The d component of the demand current is therefore used in the control circuit while the q component of the demand current is set to zero and passed through a PI controller 63 to provide a q-component of the control voltage uq. The difference in voltage across the capacitors is also set to zero to provide a zero output u0. In brief, the input voltage and current are measured by voltage and current measurement circuits 3. The phase voltages are provided to a phase lock loop PLL 6a to obtain values for the angle θ and frequency o of the AC signal. The measured currents and voltages are transformed to the DQ reference frame. As mentioned above, the q component of the current iq is set to zero. The command voltage Uref is compared to the actual output voltage Udc across the capacitors 41a, 41b and the error is provided to a PI controller 61 which outputs a reference current id_ref. The difference between the reference current and the d-component of the measured current is then provided to a PI controller 62 in the current control loop. The control voltage components ud, uq and u0 then undergo a full inverse Park transformation back to the abc reference plane by DQ-1 transformation block 64 and the resulting control signals are, in a typical system (not as shown here) modulated by PWM modulator 65 (here SPWM but other types of PWM may also be used) to provide PWM control signals PWM_A, PWM_B, PWM_C to control the switching of the rectifier switches Q.

The parts of FIG. 1 that have been described so far correspond to a typical DQ PWM rectifier control.

As mentioned above, the power quality of an active rectifier is an important consideration and power converters have to comply with PQ standards and requirements. The PQ of an active rectifier is dependent on the input inductor (43a, b, c) value and the switching frequency of the switches Q. For lower power systems (e.g. in sub-kW ranges) harmonic content is also impacted by non-ideal characteristics of the power electronics devices and gate drives, the switching pattern of the rectifier switches, the topology of the rectifier bridge and in applications where the input phase voltage differs by IV diode voltage or 20 mV switch voltage for a given current. These factors can all contribute to current distortions and are particularly apparent when the input current crosses zero. 3-phase system distortions around current zero crossings can contribute to the 3rd, 5th and 7th harmonic. Usually, to reduce these harmonics, either the switching frequency has to increase, which can result in excess heat generation and thus require cooling components to avoid circuit damage, or the input line inductor has to increase resulting in an increase in size and weight of the system. This can be undesirable in many applications e.g. in aircraft where increased heat and increased weight can be problematic.

The solution provided by this disclosure provides a compensator 7 to compensate dominant non-linearities of the converter by modifying the voltages input to the PWM modulator 65 without increasing weight or losses in the system. The solution of the disclosure involves injecting compensation voltages at the input to the PWM modulator 65. The compensator 7 interfaces to a typical DQ control as described above and injects compensation voltages to the PWM modulator based on mismatches between the demanded duty cycle to the rectifier switches Q and the actual duty cycle. The compensation voltages are obtained from a look-up table 7b based on filtered phase currents and frequency of the ACV side of the rectifier. In brief, the system is demanding a particular duty cycle, through the control system, that is not being met because of the switching delay, particularly at low currents. The compensator therefore provides additional compensating voltage to provide the demanded duty cycle.

As can be seen in FIG. 1, the input currents ia, ib, ic are filtered by low pass filter 7a and provided to the look-up table 7b together with the unfiltered frequencies w of the input voltages ua, ub, uc. Corresponding, pre-defined compensation voltages are obtained from the look-up table and are added to the control signals output by the by DQ-1 transformation block 64. The resulting compensated control signals are then provided to the PWM modulator 65. The PWM control signals to control the duty cycle of the rectifier switches Q are then compensated according to the compensation values from the look-up table 7b. The input voltage frequency @ is also provided to the low pass filter 7a such that the bandwidth of the filter is adjusted according to the frequency ω. This enables the filter to separate those harmonics that need to be compensated from the actual switching frequency, without altering their phase. This is an important feature for systems using variable frequency generators, such as are used in aircraft.

The values in the look-up table 7b between pre-set values can be interpolated based on monotonically decreasing the values with increasing input current. This means that current zero crossing areas are more compensated than high current areas.

As indicated above, the look up table values are dependent on current, but also on the input frequency of the system. This is important, since some non-linearities are more visible at low frequencies.

The use of the compensator according to this disclosure in a PWM power converter results in the reduction of low order harmonics without increasing the size and weight of the passive components and without increasing the switching frequency of the active rectifier, and using simple, readily available components. The solution is simple and cost-effective to implement and can also increase the effective resolution of the PWM for higher switching and fundamental frequencies. The solution according to the disclosure is particularly advantages in aircraft power converters but can, of course, have many other applications.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure is not limited to the particular embodiment disclosed as the best mode contemplated for carrying out this present disclosure, but that the present disclosure will include all embodiments falling within the scope of the claims.

The invention claimed is:

1. A controller for controlling the rate of switching of switches of a PWM active rectifier, the controller comprising:
   means for measuring input voltage and current to the rectifier from a power supply and means for providing a duty cycle control signal to the rectifier switches based on an error between a command voltage and an output voltage of the rectifier; and
   a compensator circuit add a compensation voltage to the controller, the compensator circuit comprising:
      a look up table containing compensating voltage values for given values of input phase current and input voltage frequency; and
      a low pass filter arranged to filter the input phase current to the rectifier based on a filter bandwidth determined according to the input voltage frequency;
      wherein the compensator circuit is arranged to receive measured input current and voltage frequency values and to output corresponding compensation voltage values from the look up table, the compensation voltages to be provided, in use, to the rectifier to adjust the switching pattern of the rectifier;
   wherein whereby the means for providing the duty cycle control signal comprises a voltage control loop and a current control loop and wherein the voltage control loop compares:
   a command voltage and the output voltage and includes a PI controller to provide a reference current according to the results of the comparison, and
   wherein the current control loop compares the reference current and a measured current and includes a current control loop PI controller to provide control voltage signals to a modulator to output corresponding duty cycle control signals, and wherein the compensator circuit outputs the compensation voltages to be combined with the control voltage signals as inputs to the modulator.

2. A controller as claimed in claim 1, wherein the look up table includes compensation voltage values for a plurality of predetermined input phase current and input voltage frequency, and wherein compensation voltage values for values of input phase current and/or input voltage frequency between said predetermined values are derived by interpolation.

3. A controller as claimed in claim 1, wherein the input phase currents are provided to the low pass filter and the input voltage frequency is provided to the low pass filter such that the low pass filter provides filtered input phase currents filtered using a bandwidth determined according to the input voltage frequency, and
   wherein the low pass filter provides the filtered input phase currents as one input to the look up table, and wherein the input voltage frequency is provided as another input to the look up table.

4. The controller of claim 1, wherein the modulator is a PWM modulator.

5. A power converter comprising:
   an active rectifier having a plurality of switches; and
   a controller as claimed in claim 1 to control the switching of the rectifier switches according to the compensated duty cycle control signal.

6. The power converter of claim 5, wherein the active rectifier is a Vienna rectifier.

* * * * *